(12) United States Patent
Yoshimura

(10) Patent No.: US 6,724,678 B2
(45) Date of Patent: Apr. 20, 2004

(54) NONVOLATILE SEMICONDUCTOR MEMORY UNIT

(75) Inventor: Yoshimasa Yoshimura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/281,249

(22) Filed: Oct. 28, 2002

(65) Prior Publication Data

US 2003/0202379 A1 Oct. 30, 2003

(30) Foreign Application Priority Data

Apr. 24, 2002 (JP) ........................... 2002-122543

(51) Int. Cl.[7] ................................................ G11C 7/00
(52) U.S. Cl. ........................................ 365/229; 365/228
(58) Field of Search ................................ 365/226, 227, 365/228, 229

(56) References Cited

U.S. PATENT DOCUMENTS

| 4,812,634 A | * | 3/1989 | Ohta et al. ................ 235/492 |
| 5,016,223 A | * | 5/1991 | Kimura et al. .............. 365/229 |
| 5,426,391 A | * | 6/1995 | Tedrow et al. .............. 365/229 |
| 5,490,117 A | * | 2/1996 | Oda et al. ................... 365/226 |
| 5,490,118 A | * | 2/1996 | Nishioka et al. ............ 365/229 |

FOREIGN PATENT DOCUMENTS

| JP | 10-333995 | 12/1998 |
| JP | P2001-43145 A | 2/2001 |

* cited by examiner

Primary Examiner—Son Mai
(74) Attorney, Agent, or Firm—McDermott, Will & Emery

(57) ABSTRACT

A nonvolatile semiconductor memory unit which is provided with a nonvolatile semiconductor memory and a controller for performing a read operation, a write operation and an erase operation on the nonvolatile semiconductor memory unit, including an external power source which derives its supply of electric power from outside, an internal power source which derives its supply of electric power from a secondary battery and is connected to the nonvolatile semiconductor memory and the controller, a voltage detecting circuit for detecting a voltage of the external power source and a switching circuit which is provided between the external power source and the internal power source and is subjected to on-off control by an output of the voltage detecting circuit so as to enable and disable the external power source, respectively.

3 Claims, 4 Drawing Sheets

NONVOLATILE SEMICONDUCTOR MEMORY UNIT

BACKGROUND OF THE INVENTION

1. Field of the Invention

The present invention generally relates to a nonvolatile semiconductor memory unit employing a nonvolatile semiconductor memory and more particularly, to a technique for preventing fatal data contamination due to sudden disconnection of a power source in the nonvolatile semiconductor memory unit.

2. Description of the Prior Art

As nonvolatile semiconductor memory units, compact flash memory cards employing flash memories, for example, a flash AT Attachment (ATA) card and a "CompactFlash" (trade name) card are widely used. Since the flash memories are nonvolatile memories, data of the flash memories is held even if their power sources are disconnected. Thus, the flash memories are widely diffused as removable media which can be easily removably inserted into these flash memory cards. In the flash memories employed in these cards, data write and data erase are performed by electron injection and electron emission at a floating gate. Data write and data erase are performed in various methods. However, generally, if control of electric charge is performed erroneously, such an inconvenience is incurred that data of an identical block cannot be accessed due to a configuration of a memory array, so that the utmost care is exercised in control of electric charge.

Conventionally, when a power source of the card has been disconnected in the course of complicated control of electric charge during data write or data erase in the flash memory by erroneously removing the card from an electronic appliance acting as a host, for example, a terminal unit, such a problem may arise that data of a corresponding block cannot be accessed due to abnormal state of electric charge.

The above problem can be avoided if the card user removes the card from the host after having confirmed that the card is in a ready state. However, in case the power source of the card has been disconnected by sudden service interruption, short break or the like, the above problem cannot be avoided.

SUMMARY OF THE INVENTION

Accordingly, an essential object of the present invention is to provide, with a view to eliminating the above mentioned drawbacks of prior art, a nonvolatile semiconductor memory unit in which fatal data contamination does not happen even if its power source is disconnected suddenly during its operation.

In order to accomplish this object of the present invention, a nonvolatile semiconductor memory unit which is provided with a nonvolatile semiconductor memory and a control means for performing a read operation, a write operation and an erase operation on the nonvolatile semiconductor memory unit, according to the present invention includes an external power source which derives its supply of electric power from outside. An internal power source derives its supply of electric power from a secondary battery and is connected to the nonvolatile semiconductor memory and the control means. A voltage detecting circuit detects a voltage of the external power source, while a switching circuit is provided between the external power source and the internal power source and is subjected to on-off control by an output of the voltage detecting circuit so as to enable and disable the external power source, respectively. When the voltage detecting circuit has detected that the voltage of the external power source is lower than a predetermined level, an output signal of the voltage detecting circuit not only is inputted, as an interrupt signal, to the control means but is inputted, as an off-state signal, to the switching circuit. The internal power source is actuated by the secondary battery for a predetermined period after the eternal power source has been disabled by the switching circuit turned off by the off-state signal. In response to the interrupt signal, the control means calls an interruption handling routine in which not only in write and erase of the nonvolatile semiconductor memory, only the write operation and the erase operation under way in the nonvolatile semiconductor memory are completed properly but by recording in the nonvolatile semiconductor memory a flag indicating that a processing has been interrupted by disconnection of the external power source and contents of residual processings to be executed, data of the nonvolatile semiconductor memory can be restored when the external power source is recovered later.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

First Embodiment

Figure 1:
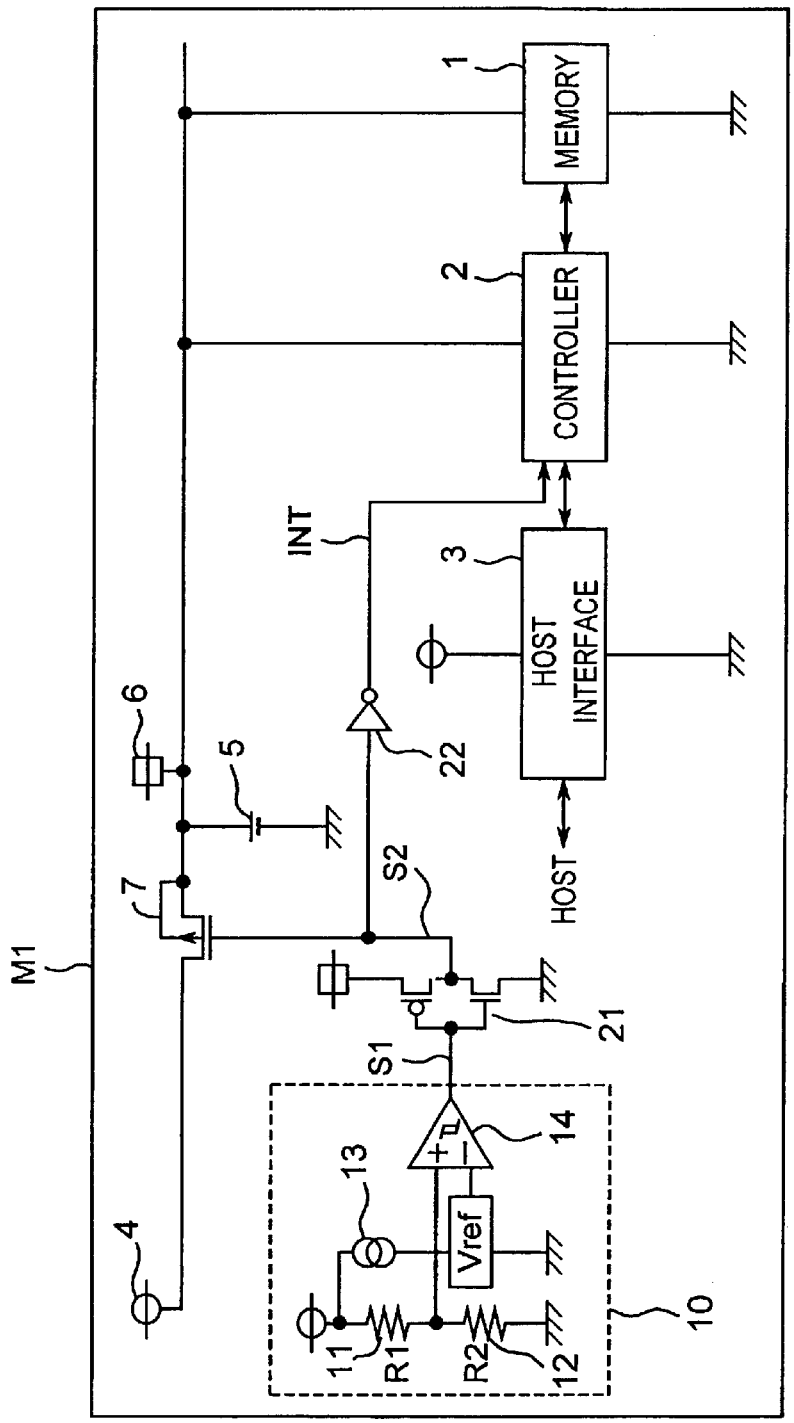
FIG. 1 is a block diagram of a nonvolatile semiconductor memory unit according to a first embodiment of the present invention.

FIG. 1 is a block diagram of a card-shaped nonvolatile semiconductor memory unit M1 according to a first embodiment of the present invention. This nonvolatile semiconductor memory unit M1 includes a nonvolatile semiconductor memory (referred to as a "memory", hereinafter) 1, a controller 2 for controlling the memory 1, a host interface 3 for exchanging data with an electronic appliance which acts as a host and on which the nonvolatile semiconductor memory unit M1 is detachably mounted, for example, a terminal unit, an external power source 4 for deriving its supply of electric power from the host, a secondary battery 5, an internal power source 6 which is connected to the secondary battery 5 and a transmission gate 7 for electrically connecting and disconnecting the external power source 4 and the internal power source 6. The internal power source 6 is also connected to the memory 1 and the controller 2.

The nonvolatile semiconductor memory unit M1 further includes a voltage detecting circuit 10, a CMOS inverter 21 which is connected to the voltage detecting circuit 10 and is driven by the internal power source 6 and an inverter 22. A junction of the transmission gate 7 and the CMOS inverter 21 is connected to the inverter 22 leading to the controller 2. The voltage detecting circuit 10 includes, in turn, a resistance element 11 having a resistance R1, a resistance element 12 having a resistance R2, a transformer 13 and a comparator 14. A detection signal S1 from the voltage detecting circuit 10 is inverted into a signal S2 by the CMOS inverter 21 and on-off control of the transmission gate 7 is performed by the signal S2. Namely, if a voltage of the external power source 4 is higher than a predetermined voltage, the output signal S1 of the comparator 14 is at high level and thus, the signal S2 is at low level. If the transmission gate 7 is formed by a p-channel MOS transistor, the transmission gate 7 is set to ON state at this time, so that the external power source 4 is electrically connected to the internal power source 6. On the contrary, if the voltage of the external power source 4 is lower than the predetermined voltage, the output signal S1 of the comparator 14 is at low level, so that the signal S2 is at high level. Hence, the transmission gate 7 is set to OFF state and thus, the external power source 4 is electrically disconnected from the internal power source 6.

Here, a threshold value of the voltage detecting circuit 10 is equal to a product of a reference voltage Vref and {(R1+R2)/R1} and therefore, can be set arbitrarily by selecting the resistances R1 and R2 of the resistance elements 11 and 12. On the other hand, the secondary battery 5 is connected to the internal power source 6. Therefore, in case the external power source 4 has been disconnected, a necessary electric power is supplied by the secondary battery 5 for a predetermined period after disconnection of the external power source 4. Even if the nonvolatile semiconductor memory unit M1 is removed from the host during data write or data erase in the memory 1, the memory 1 and the controller 2 are driven by the internal power source 6, so that data write or data erase in the memory 1 is finished completely.

Meanwhile, in case a power source of the host itself is disconnected by service interruption, etc. during data write or data erase in the memory 1, the internal power source 6 is electrically disconnected from the external power source 4 by the transmission gate 7, so that wasteful power consumption of the secondary battery 5 by impedance of the power source of the host can be prevented and thus, the internal power source 6 can secure electric power necessary for data write or data erase in the memory 1.

Furthermore, when the voltage detecting circuit 10 has detected drop of the voltage of the external power source 4 upon disconnection of the external power source 4 or the power source of the host, an interrupt signal INT is asserted. The interrupt signal INT is low-active. Since the output signal S1 is at low level at this time, the signal S2 is at high level and is inverted by the inverter 22. By the interrupt signal INT, the controller 2 can recognize disconnection of the power source.

Figure 2:
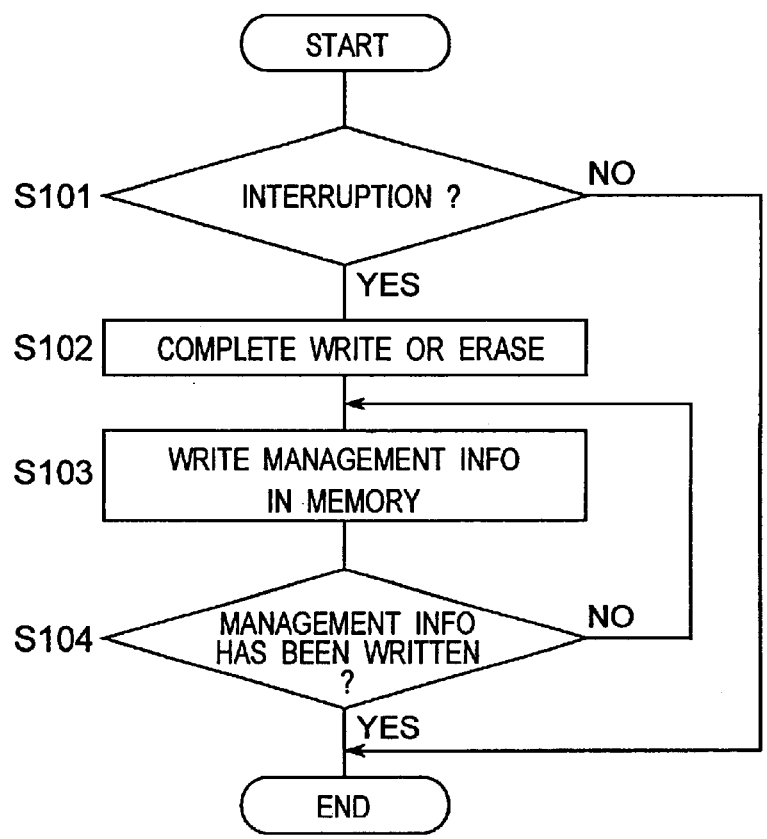
FIG. 2 is a flowchart showing an interruption handling routine of a controller at the time of disconnection of a power source in the nonvolatile semiconductor memory unit of FIG. 1.

When the controller 2 has recognized disconnection of the power source, operation of the controller 2 is shifted to an interruption handling routine. This interruption handling routine is described with reference to a flowchart of FIG. 2. Initially, at step S101, it is judged whether or not processings of the controller 2 are interrupted. In the case of "NO" at step S101 because the controller 2 is not performing any processing, disconnection of the power source does not offer no problem, so that the program flow is terminated. On the other hand, in the case of "YES" at step S101 because the controller 2 is performing any processing, the program flow proceeds to step S102. At step S102, completion of a write operation or an erase operation under way in the memory 1 is waited. At this time, data write or data erase in the memory 1 may be an error. When an error has occurred in a state where the power source is not disconnected, rerun or an alternative processing for another address is usually performed repeatedly. However, since the power source is disconnected in this program flow, such processing is not performed.

Instead, at step S103, management information is written in the memory 1. The management information includes a power source disconnection flag indicating that an ordinary processing has been interrupted by disconnection of the power source, contents of the interrupted processing of the controller 2, presence or absence of an error in the memory 1 at step S102, etc. The management information is provided for continuing, after recovery of the power source, some of the interrupted processings, which can be continued. Since it is desirable that the management information is written in the memory 1 properly, it is judged at step S104 whether or not the management information has been written in the memory 1 properly. In the case of "NO" at step S104 because there is a write error, the program flow returns to step S103. On the contrary, in the case of "YES" at step S104 because there is no write error, the program flow is terminated. In the above interruption handling routine, data of the memory 1 is restored by the controller 2.

In accordance with this embodiment, even if the power source is suddenly disconnected during operation of the nonvolatile semiconductor memory unit M1, fatal data contamination can be prevented and adverse influence exerted by disconnection of the power source can be lessened by continuing, in the processings performed prior to disconnection of the power source, some of the processings, which can be continued.

Second Embodiment

Figure 3:
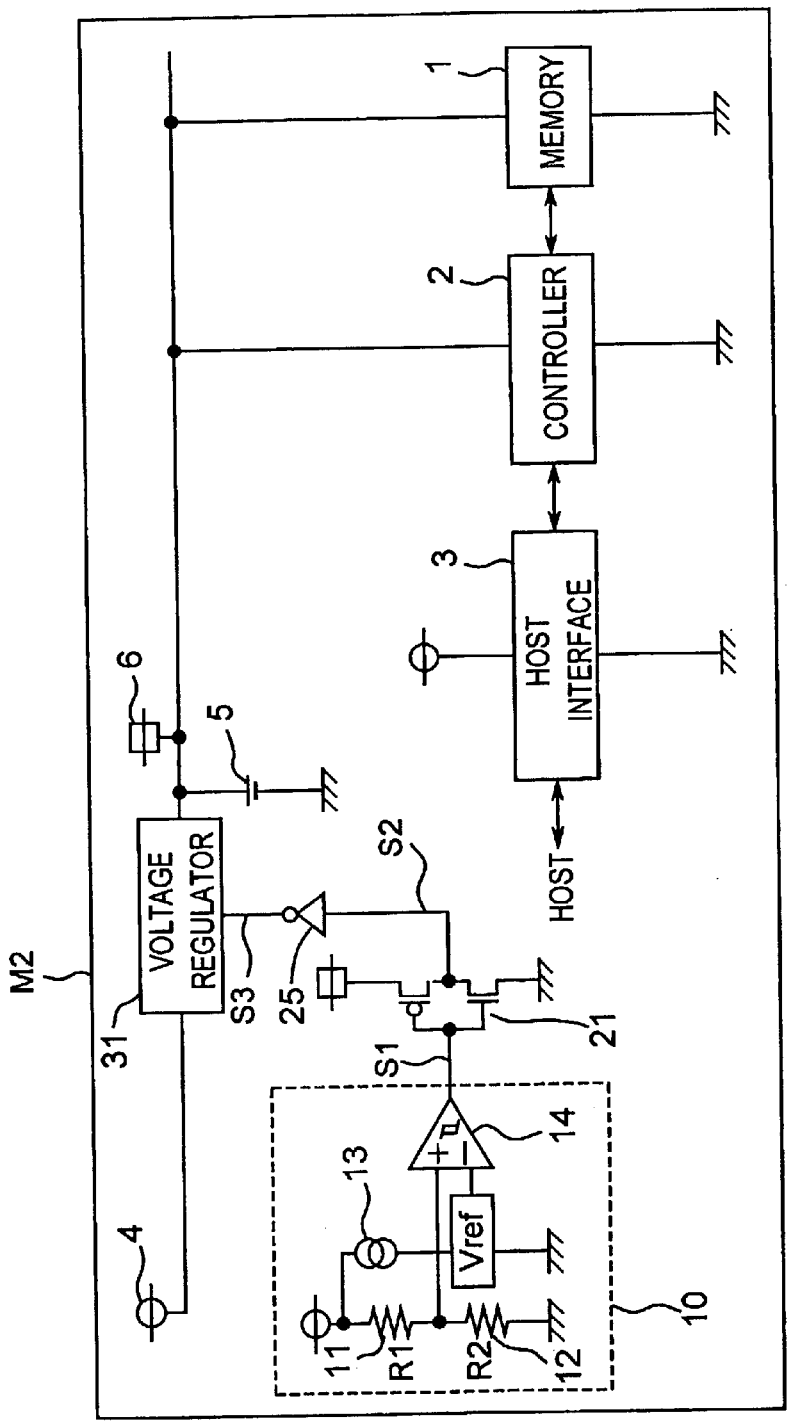
FIG. 3 is a block diagram of a nonvolatile semiconductor memory unit according to a second embodiment of the present invention.

FIG. 3 is a block diagram of a card-shaped nonvolatile semiconductor memory unit M2 according to a second embodiment of the present invention. In this nonvolatile semiconductor memory unit, the transmission gate 7 of the nonvolatile semiconductor memory unit M1 of FIG. 1 is replaced by a voltage regulator 31 and the inverter 22 of the nonvolatile semiconductor memory unit M1 of FIG. 1 is eliminated. The voltage regular 31 is, for example, a product of S-816 series commercially available from Seiko Instruments Inc. of Japan and is subjected to on-off control as described below.

Since the voltage regulator 31 is turned on in response to a high-level input signal and is turned off in response to a low-level input signal, an inverter 25 is provided between the CMOS inverter 21 and the voltage regulator 31 so as to invert the signal S2 into a signal S3 such that on-off control of the voltage regulator 31 is performed by the signal S3.

Namely, if the voltage of the external power source 4 is higher than a predetermined voltage, the output signal S1 of the comparator 14 is at high level, so that the signal S2 is at low level and thus, the signal S3 is at high level. As a result, since the voltage regulator 31 is set to ON state, the voltage of the external power source 4 is set to a constant voltage by the voltage regulator 31. On the contrary, if the voltage of the external power source 4 is lower than the predetermined value, the output signal S1 of the comparator 14 is at low level, so that the signal S2 is at high level and thus, the signal S3 is at low level. As a result, since the voltage regulator 31 is set to OFF state, a necessary electric power is supplied by the secondary battery 5 of the internal power source 6.

In a configuration in which the internal power source 6 has a voltage not more than that of the external power source 4, this nonvolatile semiconductor memory unit M2 is suitable because the voltage of the external power source 4 is set to that of the internal power source 6 by the on-state voltage regulator 31. Since other configurations and functions of the nonvolatile semiconductor memory unit M2 are similar to those of the nonvolatile semiconductor memory unit M1 of FIG. 1, the description is abbreviated for the sake of brevity.

In accordance with this embodiment, even if the power source is suddenly disconnected during operation of the nonvolatile semiconductor memory unit M2 having the configuration in which the internal power source 6 has the voltage not more than that of the external power source 4, fatal data contamination can be prevented.

Third Embodiment

Figure 4:
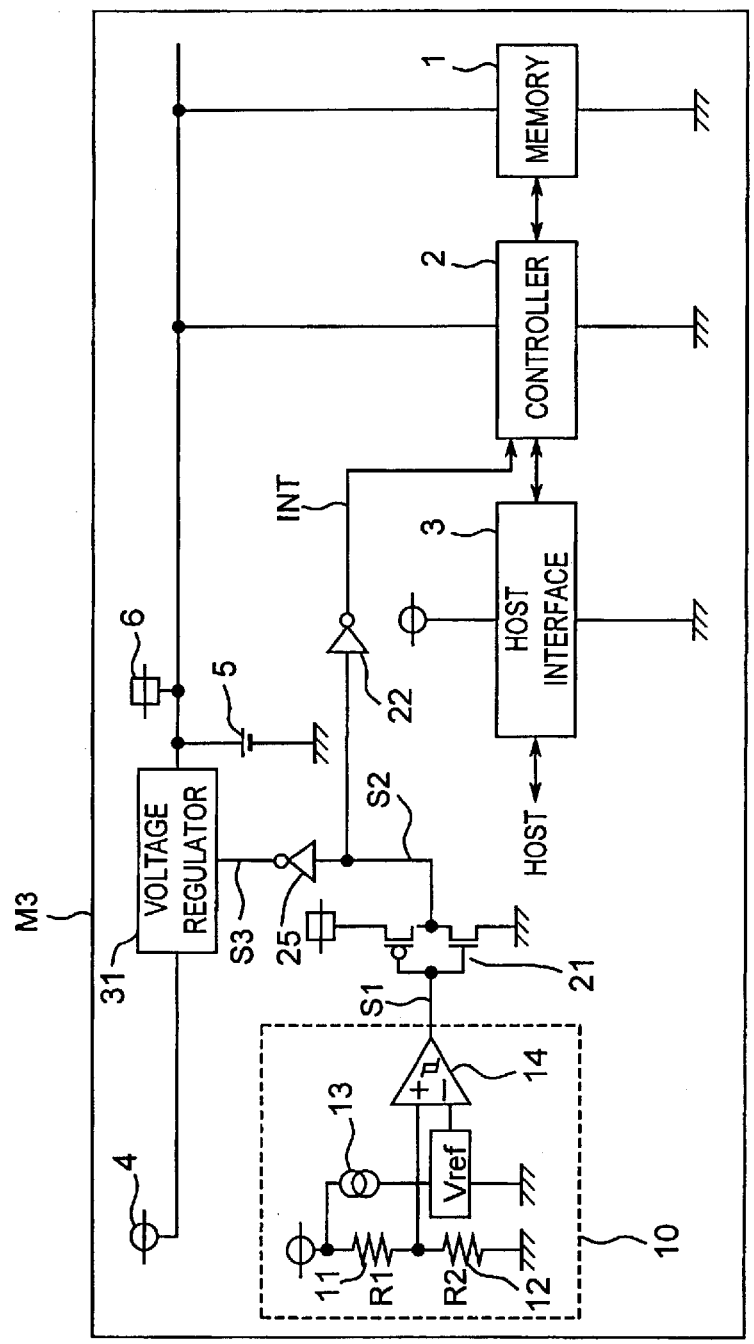
FIG. 4 is a block diagram of a nonvolatile semiconductor memory unit according to a third embodiment of the present invention.

FIG. 4 is a block diagram of a card-shaped nonvolatile semiconductor memory unit M3 according to a third embodiment of the present invention. In this nonvolatile semiconductor memory unit M3, the inverter 22 of the nonvolatile semiconductor memory unit M1 of FIG. 1 is added to the nonvolatile semiconductor memory unit M2 of FIG. 3. Since other configurations of the nonvolatile semiconductor memory unit M3 are similar to those of the nonvolatile semiconductor memory unit M2 of FIG. 3, the description is abbreviated for the sake of brevity.

Therefore, in the nonvolatile semiconductor memory unit M3, it is possible to gain functions and effects similar to those of the nonvolatile semiconductor memory unit M2 of FIG. 3 and the nonvolatile semiconductor memory unit M1 of FIG. 1.

In accordance with this embodiment, even if the power source is suddenly disconnected during operation of the nonvolatile semiconductor memory unit M3 having the configuration in which the internal power source 6 has the voltage not more than that of the external power source 4, fatal data contamination can be prevented and adverse influence exerted by disconnection of the power source can be lessened by continuing, in the processings performed prior to disconnection of the power source, some of the processings, which can be continued.

In the first to third embodiments, the secondary battery 5 may be either a chemical cell or a capacitor type cell.

As is clear from the foregoing description, the nonvolatile semiconductor memory unit which is provided with the nonvolatile semiconductor memory and the control means for performing a read operation, a write operation and an erase operation on the nonvolatile semiconductor memory unit, according to the present invention includes the external power source which derives its supply of electric power from outside, the internal power source which derives its supply of electric power from the secondary battery and is connected to the nonvolatile semiconductor memory and the control means, the voltage detecting circuit for detecting the voltage of the external power source and the switching circuit which is provided between the external power source and the internal power source and is subjected to on-off control by the output of the voltage detecting circuit so as to enable and disable the external power source, respectively, wherein when the voltage detecting circuit has detected that the voltage of the external power source is lower than the predetermined level, the output signal of the voltage detecting circuit not only is inputted, as the interrupt signal, to the control means but is inputted, as the off-state signal, to the switching circuit, wherein the internal power source is actuated by the secondary battery for a predetermined period after the eternal power source has been disabled by the switching circuit turned off by the off-state signal, wherein in response to the interrupt signal, the control means calls the interruption handling routine in which not only in write and erase of the nonvolatile semiconductor memory, only the write operation and the erase operation under way in the nonvolatile semiconductor memory are completed properly but by recording in the nonvolatile semiconductor memory the flag indicating that the processing has been interrupted by disconnection of the external power source and the contents of residual processings to be executed, data of the nonvolatile semiconductor memory can be restored when the external power source is recovered later. Therefore, in accordance with the present invention, such marked effects are gained that even if the power source is suddenly disconnected during operation of the nonvolatile semiconductor memory unit, fatal data contamination can be prevented and adverse influence exerted by disconnection of the power source can be lessened by continuing, in the processings performed prior to disconnection of the power source, some of the processings, which can be continued.

What is claimed is:

1. A nonvolatile semiconductor memory unit which is provided with a nonvolatile semiconductor memory and a control means for performing a read operation, a write operation and an erase operation on the nonvolatile semiconductor memory unit, comprising:

an external power source which derives its supply of electric power from outside;

an internal power source which derives its supply of electric power from a secondary battery and is connected to the nonvolatile semiconductor memory and the control means;

a voltage detecting circuit for detecting a voltage of the external power source; and a switching circuit which is provided between the external power source and the internal power source and is subjected to on-off control by an output of the voltage detecting circuit so as to enable and disable the external power source, respectively;

wherein when the voltage detecting circuit has detected that the voltage of the external power source is lower than a predetermined level, an output signal of the voltage detecting circuit not only is inputted, as an interrupt signal, to the control means but is inputted, as an off-state signal, to the switching circuit;

wherein the internal power source is actuated by the secondary battery for a predetermined period after the eternal power source has been disabled by the switching circuit turned off by the off-state signal;

wherein in response to the interrupt signal, the control means calls an interruption handling routine in which not only in write and erase of the nonvolatile semiconductor memory, only the write operation and the erase operation under way in the nonvolatile semiconductor memory are completed properly but by recording in the nonvolatile semiconductor memory a flag indicating that a processing has been interrupted by disconnection of the external power source and contents of residual processings to be executed, data of the nonvolatile semiconductor memory can be restored in case the external power source has been recovered later.

2. A nonvolatile semiconductor memory unit according to claim 1, wherein the switching circuit is formed by a transmission gate;

wherein when the voltage detecting circuit has detected that the voltage of the external power source is higher than the predetermined level, the output signal of the voltage detecting circuit is inputted, as an on-state signal, to the transmission gate and the voltage of the external power source is inputted to the nonvolatile semiconductor memory and the control means as it is by the transmission gate turned on by the on-state signal.

3. A nonvolatile semiconductor memory unit according to claim 1, wherein the switching circuit is formed by a constant voltage generating circuit and a voltage of the internal power source is not more than the voltage of the external power source; wherein when the voltage detecting circuit has detected that the voltage of the external power source is higher than the predetermined level, the output signal of the voltage detecting circuit is inputted, as an on-state signal, to the constant voltage generating circuit and the voltage of the external power source is inputted to the nonvolatile semiconductor memory and the control means in a state where the voltage of the external power source is set to the voltage of the internal power source by the constant voltage generating circuit turned on by the on-state signal.

* * * * *